US006515906B2

(12) United States Patent
Tedrow et al.

(10) Patent No.: US 6,515,906 B2
(45) Date of Patent: Feb. 4, 2003

(54) METHOD AND APPARATUS FOR MATCHED-REFERENCE SENSING ARCHITECTURE FOR NON-VOLATILE MEMORIES

(75) Inventors: Kerry D. Tedrow, Folsom, CA (US); Balaji Srinivasan, Fair Oaks, CA (US); Owen W. Jungroth, Sonora, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,714

(22) Filed: Dec. 28, 2000

(65) Prior Publication Data

US 2002/0085423 A1 Jul. 4, 2002

(51) Int. Cl.[7] .............................................. G11C 16/06
(52) U.S. Cl. .............................. 365/185.21; 365/185.11
(58) Field of Search ....................... 365/185.21, 185.11, 365/145, 185.01

(56) References Cited

U.S. PATENT DOCUMENTS 5,969,979 A * 10/1999 Hirano ........................ 365/145
5,999,439 A * 12/1999 Seyyedy ..................... 365/145
6,028,783 A *  2/2000 Allen et al. ................. 365/145
6,111,777 A *  8/2000 Ogiwara et al. ............ 365/145

* cited by examiner

Primary Examiner—Hoai Ho
(74) Attorney, Agent, or Firm—Blakely, Sokoloff, Taylor & Zafman LLP

(57) ABSTRACT

According to one aspect of the present invention, an apparatus is provided that includes a first global bit line, a second global bit line, a first block, a second block, and a reference cell array. The first block contains a first local bit line and a plurality of memory cells coupled to the first local bit line. The first local bit line can be selectively coupled to the first global bit line based upon a first control input. The second block contains a second local bit line and a plurality of memory cells coupled to the second local bit line. The second local bit line can be selectively coupled to the second global bit line based upon a second control input. The reference cell array contains a plurality of reference cells. The plurality of reference cells can be selectively coupled to either the first global bit line or the second global bit line based upon a third control input.

30 Claims, 9 Drawing Sheets

METHOD AND APPARATUS FOR MATCHED-REFERENCE SENSING ARCHITECTURE FOR NON-VOLATILE MEMORIES

FIELD OF THE INVENTION

The present invention relates generally to the field of non-volatile memories. More specifically, the present invention relates to an apparatus, method, and system for an improved sensing architecture for non-volatile memories.

BACKGROUND OF THE INVENTION

Metal-oxide-semiconductor ("MOS") flash memory devices typically use memory cells having electrically isolated gates, called floating gates. A cross-sectional view of a typical floating gate flash EEPROM cell 100 is shown in FIG. 1. In FIG. 1, the flash memory cell 100 is formed on a silicon substrate such as the p-type substrate 115. The flash cell 100 includes a pair of spaced-apart doped regions 112 and 113 disposed in substrate 115. Region 113 comprises a source and region 112 comprises a drain. The source 113 and the drain 112 define an active silicon region 104 and a channel between the source 113 and the drain 112. A polysilicon floating gate 110 is disposed above and between the drain 112 and source 113 and insulated therefrom by a thin layer of silicon dioxide or other electrically insulative layer 114. The floating gate 110 is insulated from a second control gate 111 disposed above floating gate 110 and insulated therefrom by an interpoly dielectric layer 109. Interpoly dielectric layer 109 may be variously formed of a single layer of silicon dioxide, or of an oxide/silicon nitride/oxide multilayer dielectric of appropriate thickness. The control gate 111 is fabricated from a second layer of polysilicon deposited subsequent to the interpoly dielectric layer 109.

A typical flash memory device typically has a memory array that is arranged into a number of blocks. Each block contains a plurality of memory cells organized into rows and columns as shown in FIG. 2. Memory cells are placed at intersections of word lines and bit lines. Each word line is connected to the gates of the memory cells in one row. Each bit line is connected to the drains of the memory cells in one column. The sources of all memory cells are connected to a common source line. In this configuration, the word lines and bit lines of a particular block only extend within that particular block. The memory array configuration shown in FIG. 2 also includes a number of global bit lines that are extended through a plurality of blocks. Each local bit line within a block can be individually selected to connect to (or deselected to disconnect from) a corresponding global bit line via a select transistor based upon corresponding local select signal. Each global bit line can be individually selected or deselected via a corresponding select transistor based upon a corresponding global select signal.

Typically, to sense data stored in the memory cells of the memory array of a flash memory device, an array of reference cells (called reference cell array) is used to compare against the data stored in the memory cells. The reference cell array typically contains flash cells trimmed to a known state. As such, the state of a particular memory cell can be compared with the known state of a corresponding reference cell using a sense amplifier to determine the state of data stored in that particular memory cell. FIG. 3 shows a block diagram of a typical flash memory architecture that contains a reference cell array 370 used for sensing data stored in a memory array 310. As shown in FIG. 3, the memory array 310 is organized into a plurality of blocks (310-0 through 310-N) each of which contains a plurality of memory cells. To perform a read operation with respect to one or more memory cells in a particular block, the respective memory cells can be individually selected by the corresponding word line(s), local bit line(s) (not shown) and global bit line(s). For example, to read data stored in a particular memory cell, the drain of that particular memory cell is coupled to a corresponding global bit line which is coupled to a corresponding sense amplifier. The drain of corresponding reference cell in the reference cell array is also coupled to the sense amplifier. The current from the selected memory cell is then compared against the current from the corresponding reference cell to determine the state of data stored in the selected memory cell. A problem with this architecture is that the global bit line that is used to connect the selected memory cell to the sense amplifier is much longer than the line used to connect the reference cell to the sense amplifier. As a result, the coupling capacitance and hence the coupling noise associated with the global bit line is much greater than that associated with the line connecting the reference cell to the sense amplifier. Therefore, the difference between the length of the global bit line and that of the reference line can negatively affect the accuracy of the reading of the selected memory cell. This problem may be much more severe with respect to multi-level cells which are used to store multiple bits of data per memory cell by charging the polysilicon floating gate of a memory cell to different levels. Reading of multi-level cells therefore requires a much higher level of sensing accuracy and lower tolerance for any difference in coupling capacitance and coupling noise between the line that connects the memory cell to the sense amplifier and the line that connects the reference cell to the sense amplifier.

Accordingly, there exists a need for an improved sensing architecture in flash memory devices that will enhance the accuracy of data reading/sensing.

BRIEF DESCRIPTION OF THE DRAWINGS

The features and advantages of the present invention will be more fully understood by reference to the accompanying drawings, in which.

DETAILED DESCRIPTION

Figure 1:
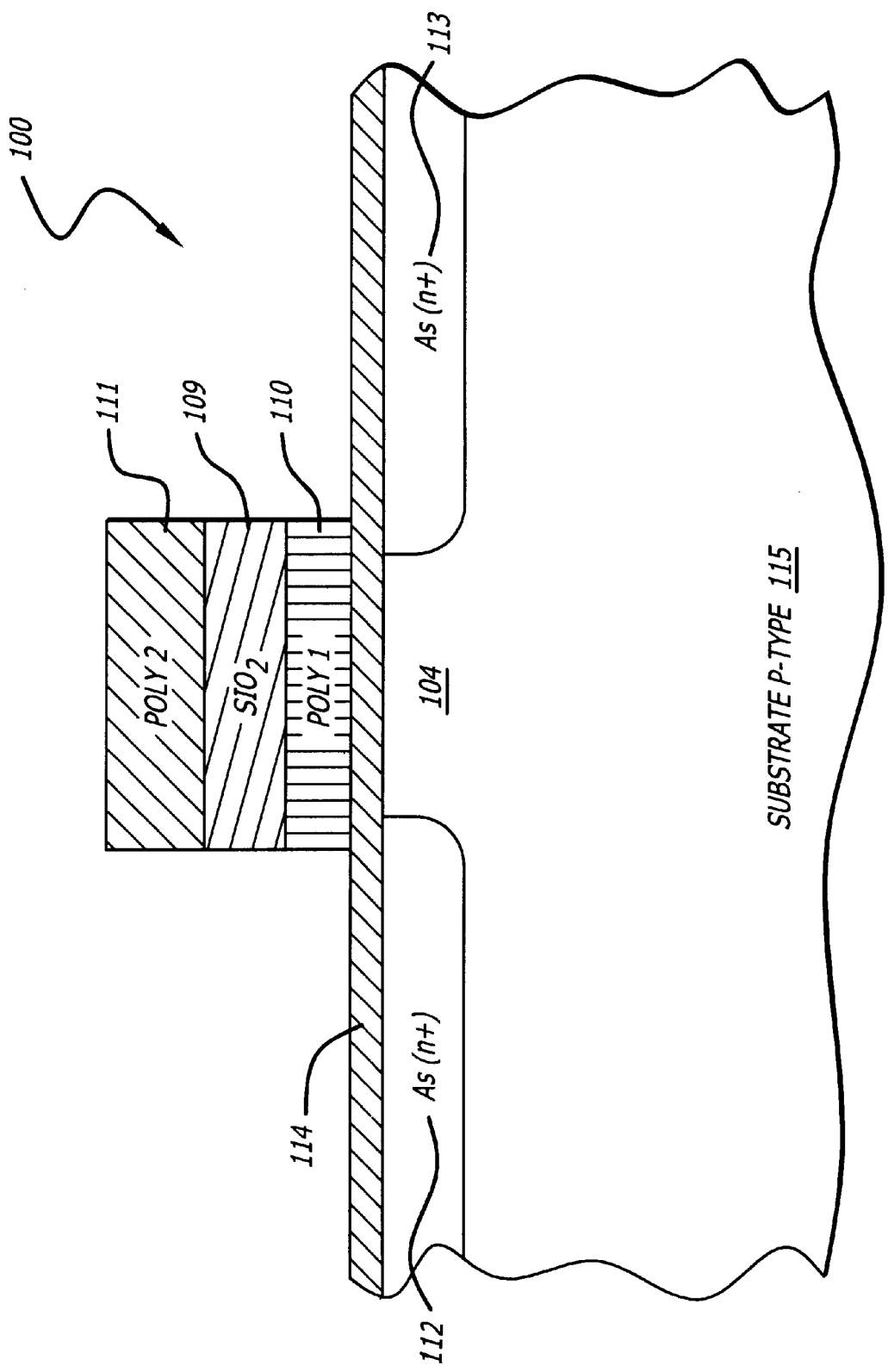
FIG. 1 is a cross-sectional view of a typical floating gate flash EEPROM cell.
Figure 2:
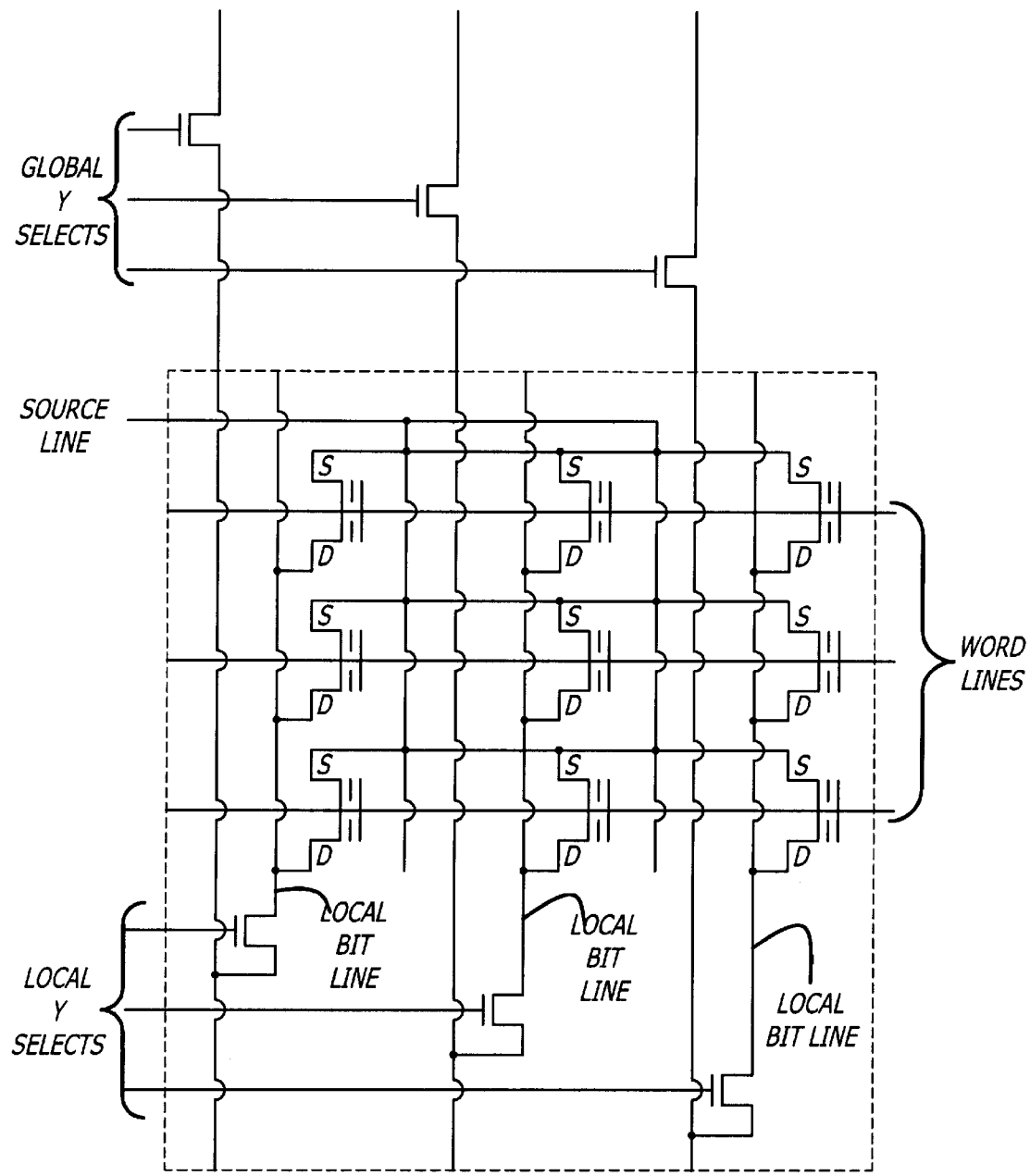
FIG. 2 shows a block diagram of one embodiment of a typical flash memory configuration.
Figure 3:
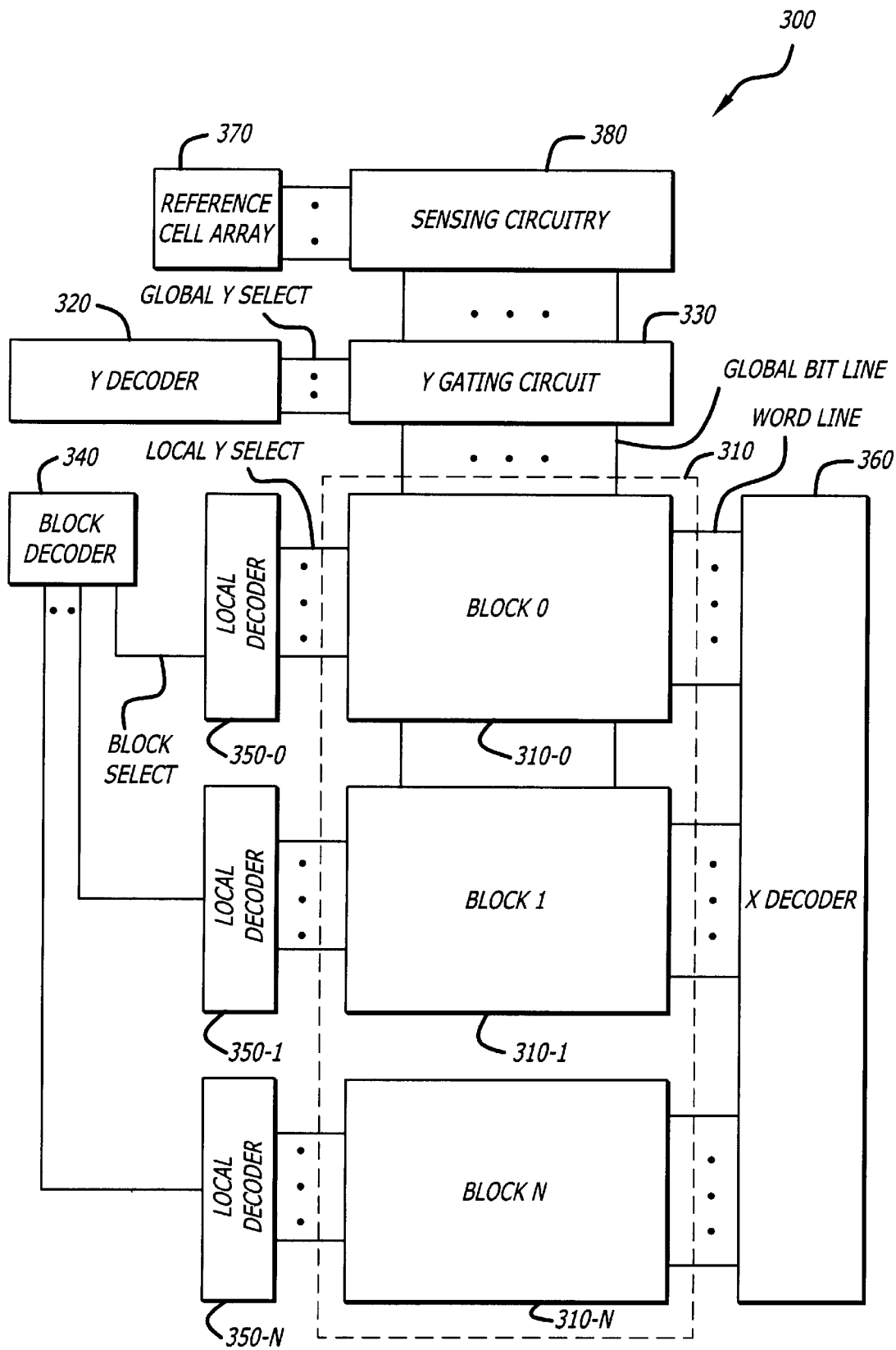
FIG. 3 shows a block diagram of one embodiment of a flash memory configuration according to prior art for reading operations.

In the following detailed description numerous specific details are set forth in order to provide a thorough understanding of the present invention. However, it will be appreciated by one skilled in the art that the present invention may be understood and practiced without these specific details.

In the discussion below, the teachings of the present invention are utilized to implement a method, apparatus, and a system for an improved sensing architecture/configuration for non-volatile memory devices (e.g., flash memory). In one embodiment, a non-volatile memory in accordance with the teachings of the present invention includes a first global bit line, a second global bit line, a first memory block, a second memory block, and a reference cell array that is used to sense data stored in the first block and the second block. The first block includes a first local bit line and a plurality of memory cells coupled to the first local bit line. The first local bit line can be selectively coupled to the first global bit line based upon a first control input signal. The second block includes a second local bit line and a plurality of memory cells coupled to the second local bit line. The second local bit line can be selectively coupled to the second global bit line based upon a second control input signal. In one embodiment, the reference cell array contains a plurality of reference cells each of which can be selectively coupled to either the first global bit line or the second global bit line based upon a third control input signal. In one embodiment, the first local bit line is coupled to the first global bit line when the first control input signal is set to a first value (e.g., 5 volts) and is decoupled from the first global bit line when the first control input signal is set to a second value (e.g., zero volts or ground). In one embodiment, the second local bit line is coupled to the second global bit line when the second control input signal is set to a first value (e.g., 5 volts) and is decoupled from the second global bit line when the second control input signal is set to a second value (e.g., zero volts or ground). In one embodiment, a reference cell is coupled to the first global bit line and decoupled from the second global bit line when the third control input signal is set to a first value and vice versa when the third control input signal is set to a second value. In another embodiment, a reference cell is coupled to the second global bit line and decoupled from the first global bit line when the third control input signal is set to the first value and vice versa when the third control input signal is set to the second value. In one embodiment, to read data stored in a memory cell in the first block, the respective memory cell in the first block is coupled to the first global bit line and the corresponding reference cell is coupled to the second global bit line. In one embodiment, to read data stored in a memory cell in the second block, the respective memory cell in the second block is coupled to the second global bit line and the corresponding reference cell is coupled to the first global bit line. The first and second global bit lines are selectively coupled to the inputs of a sense amplifier that is used to compare the current from selected memory cell and the current from the corresponding reference cell. In one embodiment, the first and second global bit lines are adjacent global bit lines and the first and second block are adjacent blocks in the memory array. In one embodiment, the global bit lines are twisted in the layout. The twisting of the global bit lines enable uniform coupling of the global bit lines to their respective neighbors.

The teachings of the present invention are applicable to any scheme, method and system for reading/sensing data in non-volatile memory devices. However, the teachings of the present invention are not limited to flash and non-volatile memory applications and can also be applied to any other circuits, schemes, methods, and systems for other types of memory devices.

Figure 4:
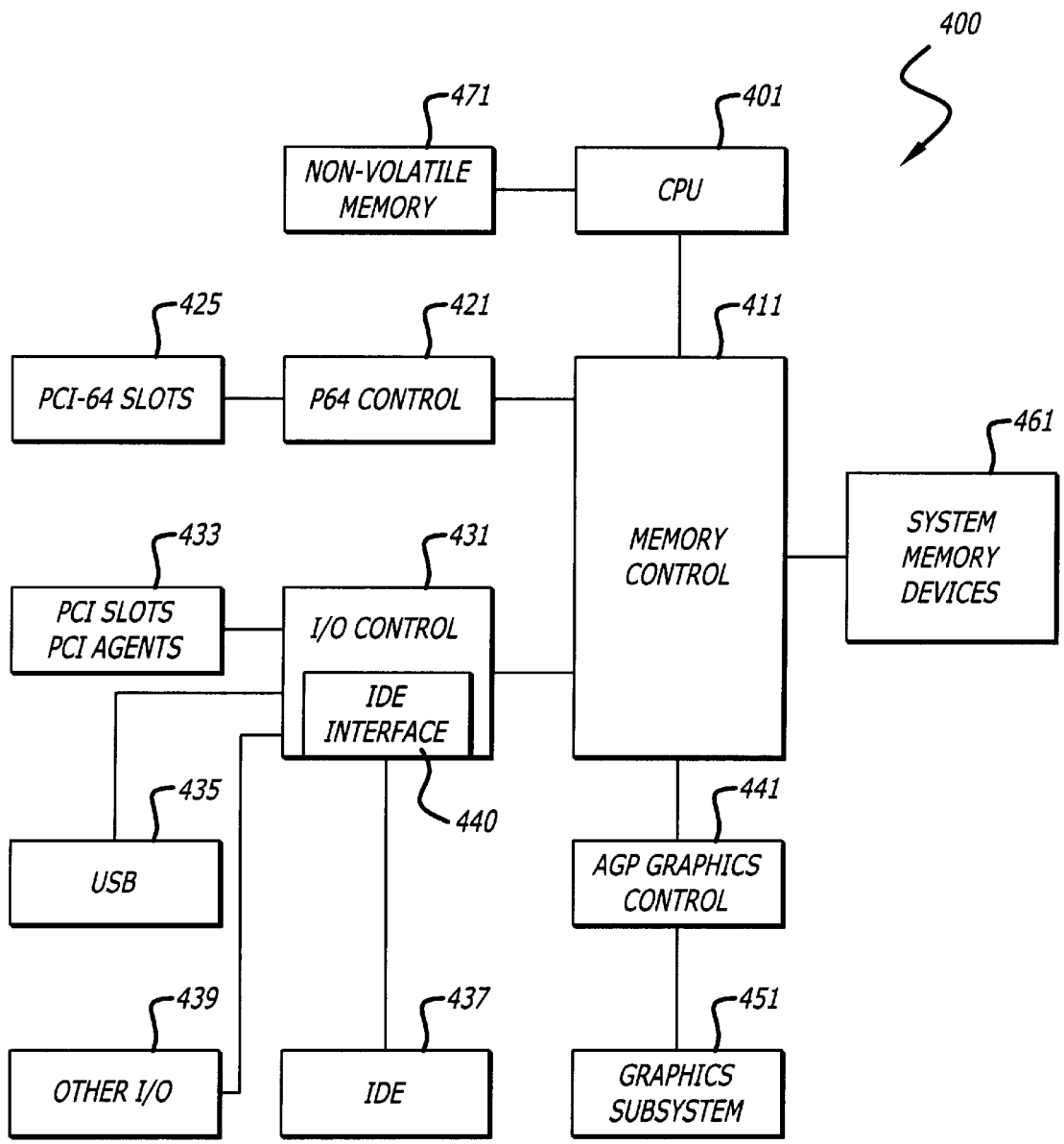
FIG. 4 shows a block diagram of one embodiment of a system in which the teachings of the present invention are implemented.

FIG. 4 shows a block diagram of one embodiment of a system configuration in which the teachings of the present invention are implemented. The system configuration 400 includes one or more central processing unit (CPU) 401, a memory control hub (also referred to as memory control unit or memory controller) 411, a P64 control unit 421, an Input/Output (IO) control unit 431, a graphics controller 441 coupled to a graphics subsystem 451, a plurality of system memory devices 461, and a non-volatile memory device 471. In one embodiment, the non-volatile memory device 471 may include one or more flash memory devices. For the purposes of the present specification, the term "processor" or "CPU" refers to any machine that is capable of executing a sequence of instructions and shall be taken to include, but not be limited to, general purpose microprocessors, special purpose microprocessors, multi-media controllers and microcontrollers, etc. In one embodiment, the CPU 401 is a general-purpose microprocessor that is capable of executing an Intel Architecture instruction set. The CPU 401, the P64 control unit 421, the IO control unit 431, and the AGP graphics control unit 441 access the system memory devices 461 via the memory control unit 411. The memory control unit 411, in one embodiment, is responsible for servicing all memory transactions that target the system memory devices 461. The memory control unit 411 can be a stand-alone unit, an integrated part of a chipset, or a part of some larger unit that control the interfaces between various system components and the system memory devices 461. The P64 control unit 421 provides the interface control between a plurality of PCI-64 slots 425 and the memory control unit 411. The IO control unit 431 provides the interface control between the memory control unit 411 and various IO devices and ports including the PCI slots and PCI agents 433, a plurality of USB ports 435, a plurality of IDE devices 437, and other IO devices 439. The IO control unit 431, in one embodiment, contains an IDE host interface unit 440 that controls the interface between the IDE devices 437 and the memory control unit 411. The AGP graphics control unit 441 provides the interface control between the graphics subsystem 451 and the memory control unit 411. The IDE host interface unit 440 can be a stand-alone unit, an integrated part of a chipset, or a part of some larger unit that controls the interfaces between various IDE devices 437 and the system memory devices 461.

Figure 5:
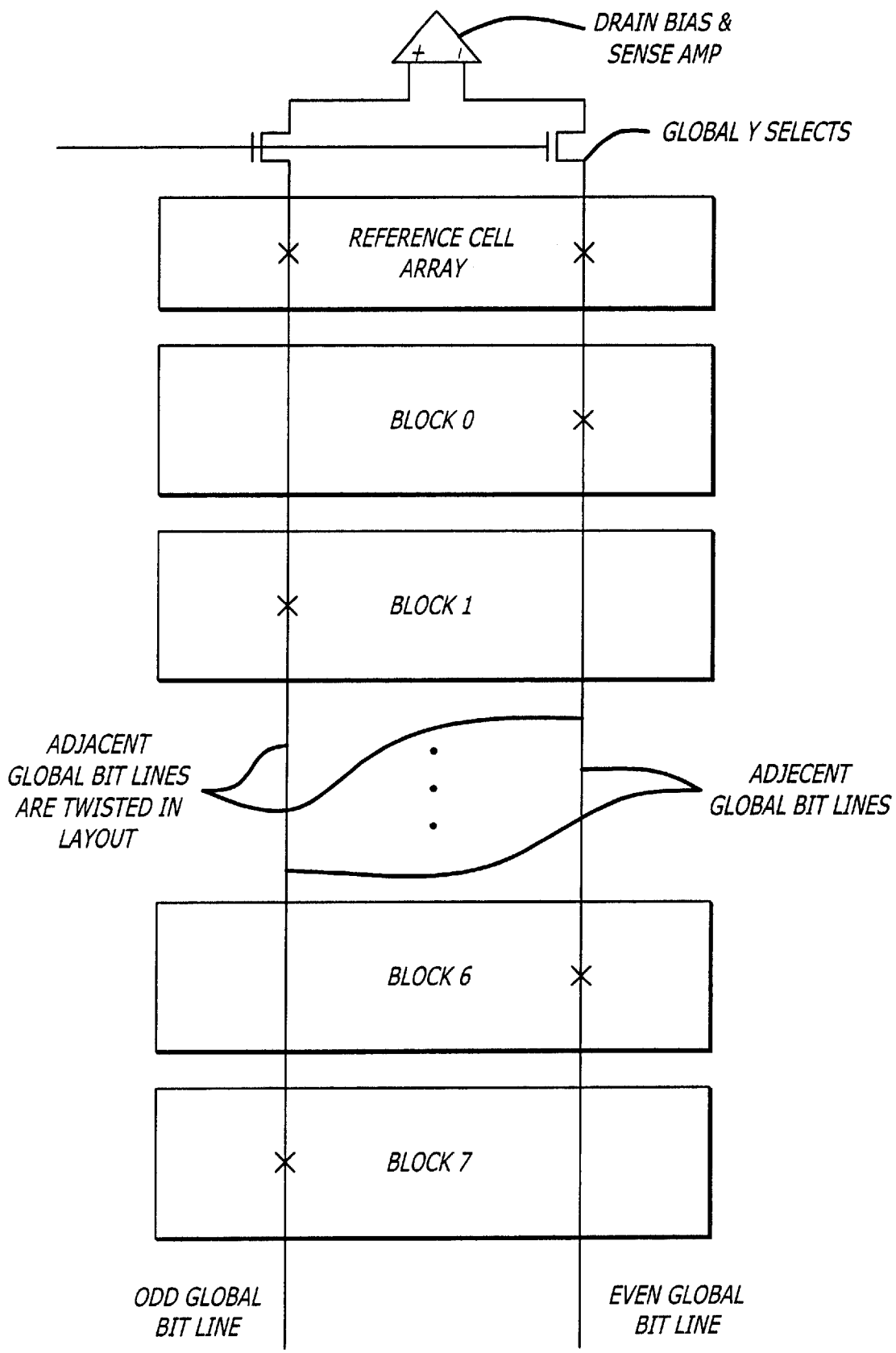
FIG. 5 is a block diagram of one embodiment of a memory configuration according to the teachings of the present invention.

FIG. 5 shows a block diagram of one embodiment of a sensing architecture/configuration for a non-volatile memory device such as a flash memory device in accordance with the teachings of the present invention. The flash memory device in FIG. 5 includes a memory array 510 organized into a plurality of blocks and a reference cell array 520. For illustration and explanation purposes, each block in the memory array can be referenced as an even-numbered block or an odd-numbered block although each block can also be referenced differently in other implementations or applications of the present invention. In one embodiment, each block in the memory array contains a plurality of memory cells that are organized into rows and columns.

Each block contains a plurality of word lines (not shown) and a plurality of local bit lines (not shown). Memory cells in each block are placed at intersections of corresponding words lines and local bit lines. Each word line is connected to the control gates of the memory cells in one row and each local bit line is connected to the drains of the memory cells in one column. In one embodiment, the sources of all memory cells in one block are connected to a common source line. In the configuration shown in FIG. 5, the word lines and local bit lines of a particular block only extend within that particular block. Also shown in FIG. 5 are two global bit lines each of which can be selectively coupled to the reference cell array 520 and to every other block in the memory array 510. For illustration and explanation purposes, the configuration in FIG. 5 only shows two global bit lines. It should be understood and appreciated by one skilled in the art that everything discussed herein are applicable to other configurations having different numbers of global bit lines. In one embodiment, the two global bit lines shown in FIG. 5 are adjacent global bit lines and are twisted in the layout. For easy references, one of the global bit lines is referred to as an odd-numbered global bit line and other global bit line is referred to as an even-numbered global bit line. In one embodiment, the odd-numbered global bit line can be selectively connected to the corresponding reference cells in the reference cell array 520 and the corresponding memory cells in each of the odd-numbered blocks (e.g., block 1, block 3, block 5, block 7, etc.). The even-numbered global bit line can be selectively connected to the corresponding reference cells in the reference cell array 520 and the corresponding memory cells in each of the even-numbered-umbered blocks (e.g., block 0, block 2, block 4, block 6, etc.). In another embodiment, the odd-numbered global bit line can be selectively connected to the reference cell array 520 and to all even-numbered blocks while the even-numbered global bit line can be selectively connected to the reference cell array 520 and to all odd-numbered blocks.

Referring again to FIG. 5, the global bit lines can be selectively coupled to the inputs of a corresponding sense amplifier 530 via a control input signal that is also referred to as global Y-select signal. It can be seen that in the configuration shown in FIG. 5, the memory array and the reference cell array share the global bit lines and global Y-selects. In one embodiment, a reference cell in the reference cell array 520 can be coupled to either the odd-numbered global bit line or the even-numbered global bit line based upon one or more select signals that are also referred to as the reference cell array local select signals. In one embodiment, each local bit line in an odd-numbered block (e.g., block 1, etc.) can be selectively coupled to the odd-numbered global bit line based upon a corresponding local Y select signal (not shown). Likewise, each local bit line in an even-numbered block (e.g., block 0, etc.) can be selectively coupled to the even-numbered global bit line based upon a corresponding local Y select signal (not shown). As such, memory cells in each block can be individually selected and coupled to the corresponding global bit line (e.g., the odd-numbered global bit line or the even-numbered-umbered global bit line depending on whether the respective block is an odd-numbered block or an even-numbered block). In one embodiment, to read data stored in a memory cell in an even-numbered block (e.g., block 0, etc.), the respective memory cell in the even-numbered block is selected and coupled to the even-numbered global bit line and a corresponding reference cell is selected and coupled to the odd-numbered global bit line.

To read data stored in a memory cell in an odd-numbered block (e.g., block 1, etc.), the respective memory cell in the odd-numbered block is selected and coupled to the odd-numbered global bit line and a corresponding reference cell is selected and coupled to the even-numbered global bit line. As such, a corresponding reference cell is selectively coupled to either the odd-numbered global bit line or the even-numbered global bit line depending on whether the respective memory cell is in an even-numbered block or an odd-numbered block, respectively. Thus, no matter where the memory cell is located in the memory array, the lines via which the respective memory cell and the corresponding reference cell are coupled to a sense amplifier for reading operation are of approximately the same length. This is because the adjacent global bit lines (e.g., the odd-numbered and even-numbered global bit lines shown in FIG. 5) are used to couple the memory cell and the corresponding reference cell to the corresponding sense amplifier. As such, coupling capacitance and hence coupling noise associated with each global bit line would be substantially the same and therefore be cancelled out by the coupling capacitance and coupling noise of the other global bit line. Since the coupling noise associated with each input into the sense amplifier is substantially the same and thus cancelled out in this new sensing architecture/configuration, the accuracy of data reading/sensing of memory cells according to the teachings of the present invention is significantly improved. The high level of accuracy obtained based upon the teachings of the present invention is especially important with respect to multi-level cells employed in more recent generations of flash memory devices.

Figure 5B:
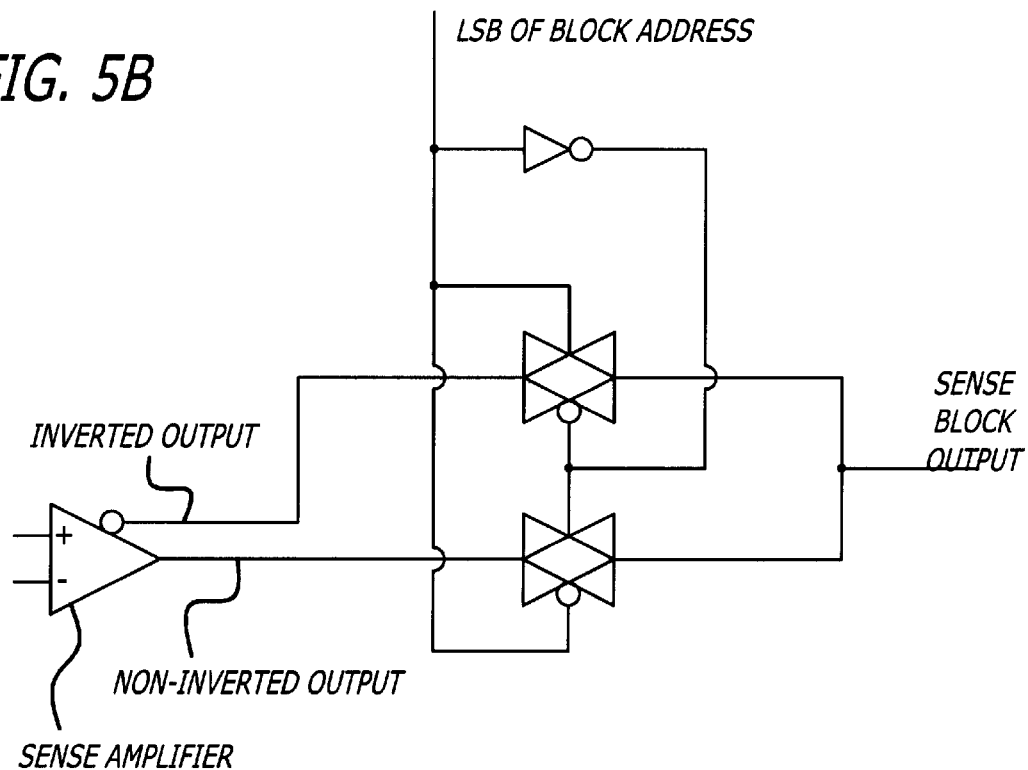
FIG. 5B is a diagram of one embodiment of a circuit for correcting state inversion.

Referring to FIG. 5 it can be seen that the reference cell is coupled to either the positive or negative input of the sense amplifier, depending upon whether the block being read is an even-numbered block or odd-numbered block. As such, the state definition of even-numbered blocks will be inverted relative to odd-numbered blocks. For example, a flash cell which would read as a one state in an even-numbered block would read as a zero state in an odd-numbered block, and vice-versa. This state inversion needs to be corrected to ensure proper operation of the memory device. FIG. 5B shows one embodiment for correcting the inversion. As shown in FIG. 5B the sense amplifier has two outputs, an inverted output and a non-inverted output. Each of the two outputs is coupled to the final output (e.g., the sense block output) via pass gates which are controlled by the least significant bit of the block address. When an even-numbered block is selected for reading the least significant bit of the block address will be at a low level and the non-inverted output of the sense amplifier will be selected. When an odd-numbered block is selected for reading the least significant bit of the block address will be at a high level and the inverted output of the sense amplifier will be selected. Accordingly, the state definition of even-numbered and odd-numbered blocks will now be in agreement.

Figure 6:
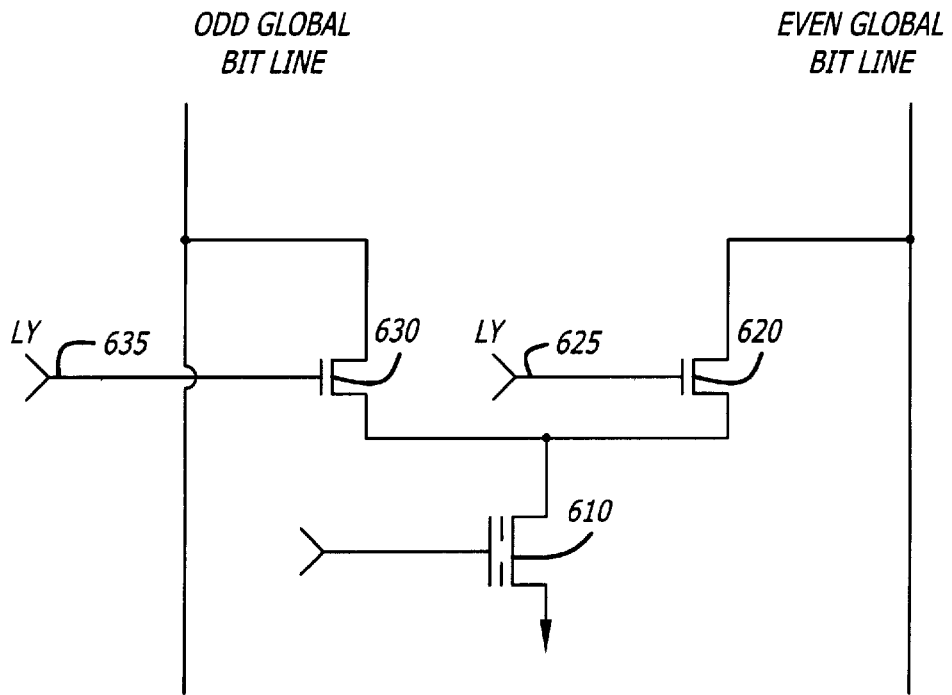
FIG. 6 shows a diagram of one embodiment of a reference cell array configuration in which a reference cell can be selectively coupled to either a corresponding odd-numbered global bit line or a corresponding even-numbered global bit line.

FIG. 6 shows a diagram of one embodiment of a reference cell array configuration in which one or more reference cells can be selectively coupled to either a corresponding odd-numbered global bit line or a corresponding even-numbered global bit line. As shown in FIG. 6, a reference cell 610 can be selectively coupled to or decoupled from the even-numbered global bit line via a select transistor 620 based upon a local select signal 625. Likewise, the reference cell 610 can be selectively coupled to or decoupled from the odd-numbered global bit line via a select transistor 630 based upon a local select signal 635. In one embodiment, the reference cell can be coupled to the even-numberedumbered global bit line and decoupled from the odd-numbered global bit line by setting the local select signal 625 to a high value (e.g., 5 volts) to turn on the select transistor 620 and setting the local select signal 635 to a low value (e.g., ground) to turn off the select transistor 630. Similarly, the reference cell can be coupled to the odd-numbered global bit line and decoupled from the even-numbered global bit line by setting the local select signal 635 to a high value (e.g., 5 volts) to turn on the select transistor 630 and setting the local select signal 625 to a low value (e.g., ground) to turn off the select transistor 620. As such, each reference cell in the reference cell array 520 can be selectively coupled to a corresponding global bit line for a sensing/reading operation with respect to a corresponding memory cell in the memory array 510 by setting the corresponding local select signals for the respective reference cell to the appropriate values. For example, to perform a read operation with respect to a memory cell in an odd-numbered block, the respective memory cell in the odd-numbered block is coupled to the odd-numbered global bit line and the reference cell 610 is coupled to the even-numbered global bit line and vice versa.

Figures 7A, 7B:
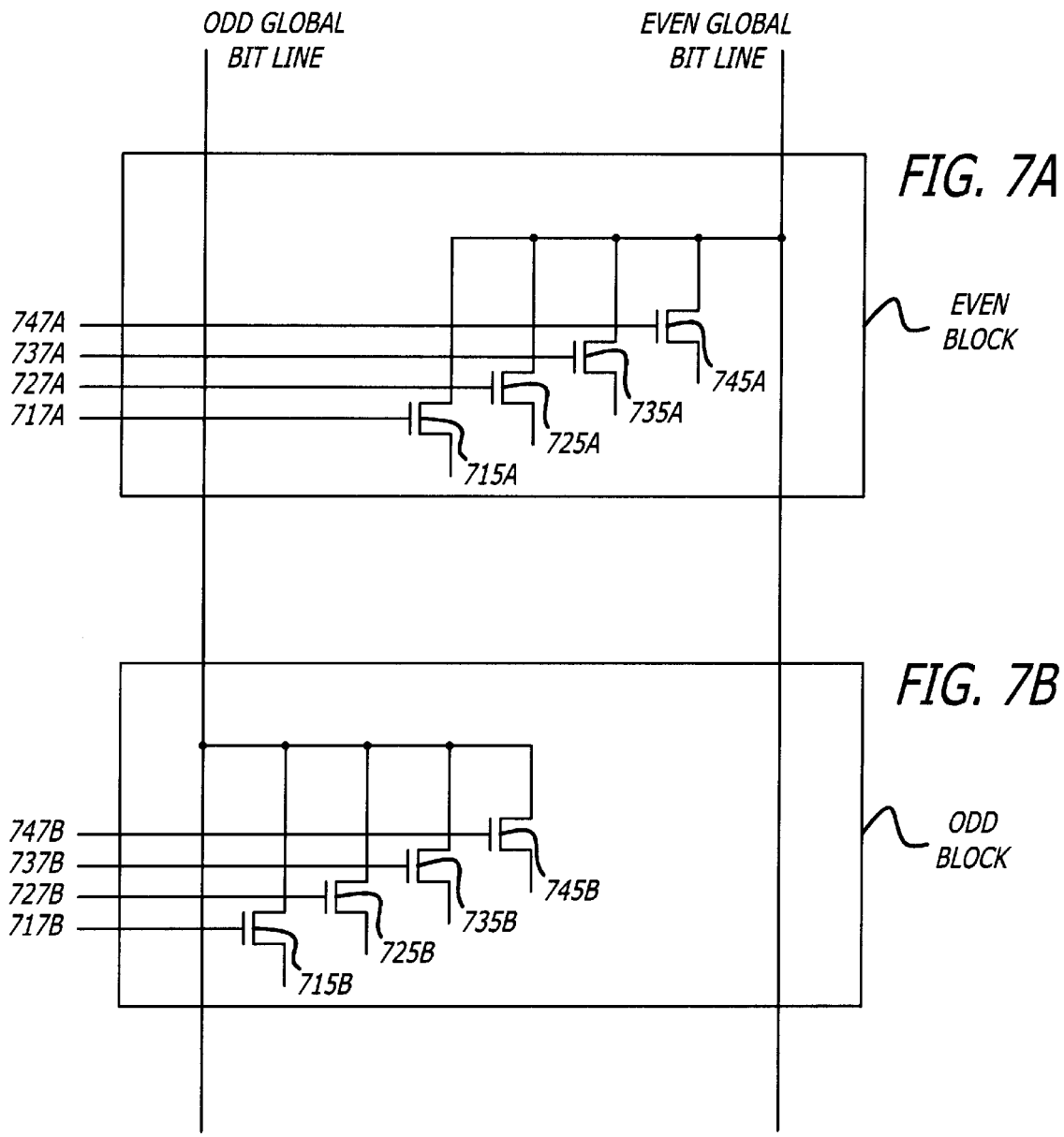
FIGS. 7A and 7B show a diagram of one embodiment of a memory array configuration in which a memory cell can be selectively coupled to a corresponding global bit line.

FIGS. 7A and 7B show a block diagram of one embodiment of a memory array configuration in which one or more memory cells in a particular block can be selectively coupled to a corresponding global bit line. In one embodiment, one or more local bit lines (not shown) in an even-numbered block (e.g., block 0) can be selectively coupled to or decoupled from the corresponding even-numbered global bit line via the corresponding select transistors. For example, a local bit line can be coupled to or decoupled from the even-numbered global bit line via a select transistor 715A based upon a local select signal 717A, another local bit line can be coupled to or decoupled from the even-numbered global bit line via a select transistor 725A based upon a local select signal 727A, and so on. In one embodiment, each of the local bit lines can be coupled to the corresponding even-numbered global bit line by setting the corresponding select signal to a high value (e.g., 5 volts) to turn on the corresponding select transistor. Likewise, each of the local bit lines can be decoupled from the corresponding even-numbered global bit line by setting the corresponding select signal to a low value (e.g., ground) to turn off the corresponding select transistor. As such, to perform a read operation with respect to a memory cell coupled to a local bit line, for example the local bit line coupled to the select transistor 715A, the respective memory cell is coupled to the even-numbered global bit line via the respective local bit line by turning on the select transistor 715A to couple the respective local bit line to the even-numbered global bit line and turning off other select transistors to decouple other local bit lines from the even-numbered global bit line. As such, a memory cell in the even-numbered block such as block 0 can be coupled to the corresponding even-numbered global bit line for a read operation by setting the corresponding local select signals to the appropriate values.

As shown in FIG. 7B, one or more local bit lines (not shown) in an odd-numbered block (e.g., block 1) can be selectively coupled to or decoupled from the corresponding odd-numbered global bit line via the corresponding select transistors. For example, a local bit line can be coupled to or decoupled from the odd-numbered global bit line via a select transistor 715B based upon a local select signal 717B, another local bit line can be coupled to or decoupled from the odd-numbered global bit line via a select transistor 725B based upon a local select signal 727B, and so on. In one embodiment, each of the local bit lines can be coupled to the corresponding odd-numbered global bit line by setting the corresponding select signal to a high value (e.g., 5 volts) to turn on the corresponding select transistor. Likewise, each of the local bit lines can be decoupled from the corresponding odd-numbered global bit line by setting the corresponding select signal to a low value (e.g., ground) to turn off the corresponding select transistor. As such, to perform a read operation with respect to a memory cell coupled to a local bit line, for example local bit line that is coupled to select transistor 715B, the respective memory cell is coupled to the odd-numbered global bit line via the respective local bit line by turning on the select transistor 715B to couple the respective local bit line to the odd-numbered global bit line and turning off other select transistors to decouple other local bit lines from the odd-numbered global bit line. Accordingly, a memory cell in the odd-numbered block such as block 1 can be coupled to the corresponding odd-numbered global bit line for a read operation by setting the corresponding local select signals to the appropriate values.

Figure 8:
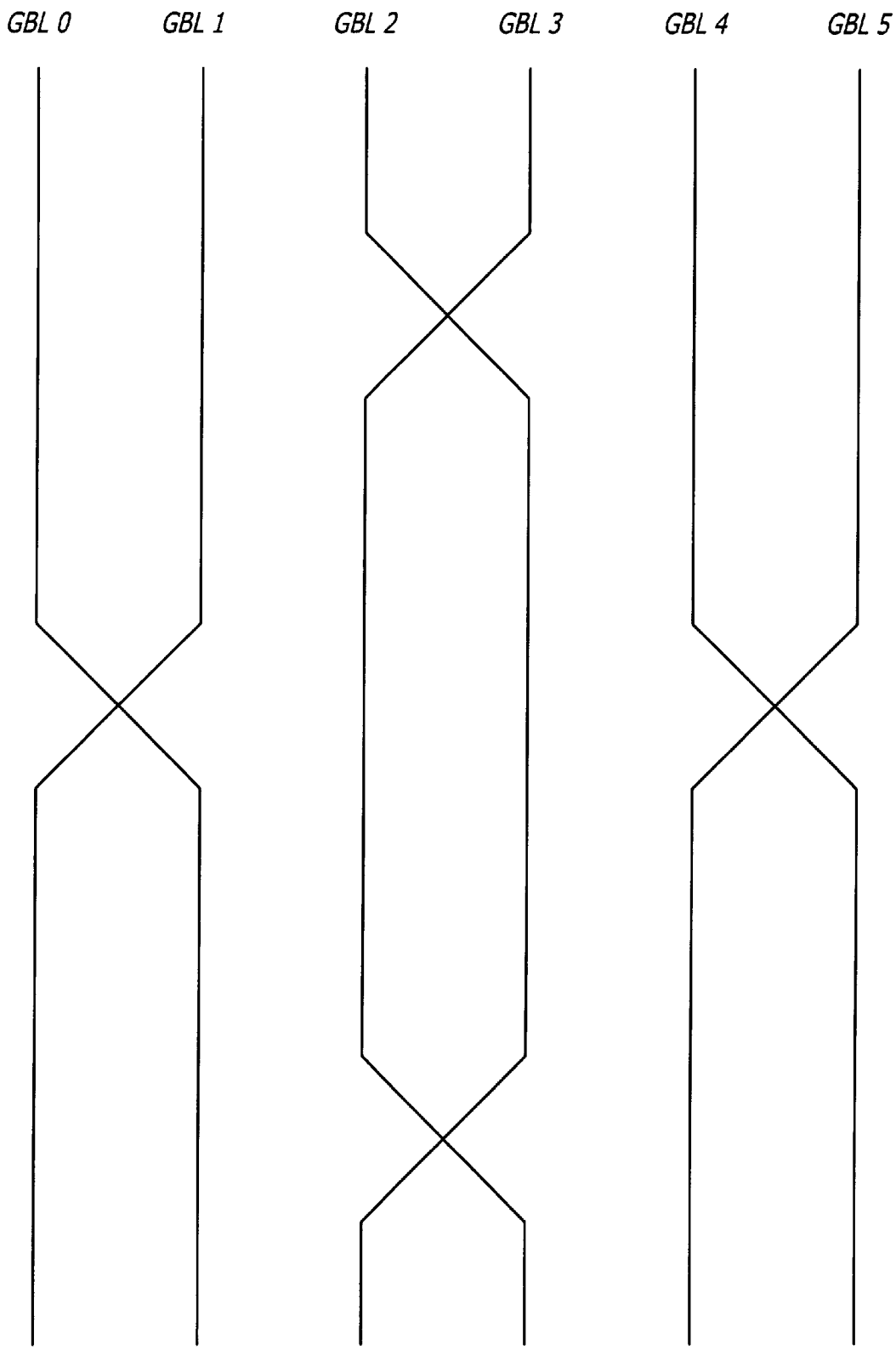
FIG. 8 shows a block diagram of one embodiment of a configuration in which adjacent global bit lines are twisted in the layout.

FIG. 8 shows a diagram of one embodiment of a memory configuration in which adjacent global bit lines are twisted in the layout to enable uniform coupling of global bit lines to their neighbors. The twisting of the adjacent global bit lines further reduces any difference in coupling capacitance and coupling noise between two adjacent global bit lines that are used to couple a memory cell and a corresponding reference cell to a sense amplifier for reading operations. As described above, the new sensing architecture in accordance with the teachings of the present invention significantly improves the accuracy of the sensing operation since the memory cell and the reference cell are coupled to the inputs of the sense amplifier via adjacent global bit lines that are of the same length or substantially the same length. Coupling capacitance and coupling noise associated with one global bit line is therefore the same or substantially the same as the coupling capacitance and coupling noise of the adjacent global bit line. Accordingly, coupling capacitance and coupling noise associated with one global bit line is cancelled out by the coupling capacitance and coupling noise associated with the adjacent global bit line. The twisting of the global bit lines in the layout further improves uniform coupling of the global bit lines because any impedance or capacitive differential due to the neighboring global bit lines will be equally shared by the two adjacent global bit lines that are twisted in the lay out.

Figure 9:
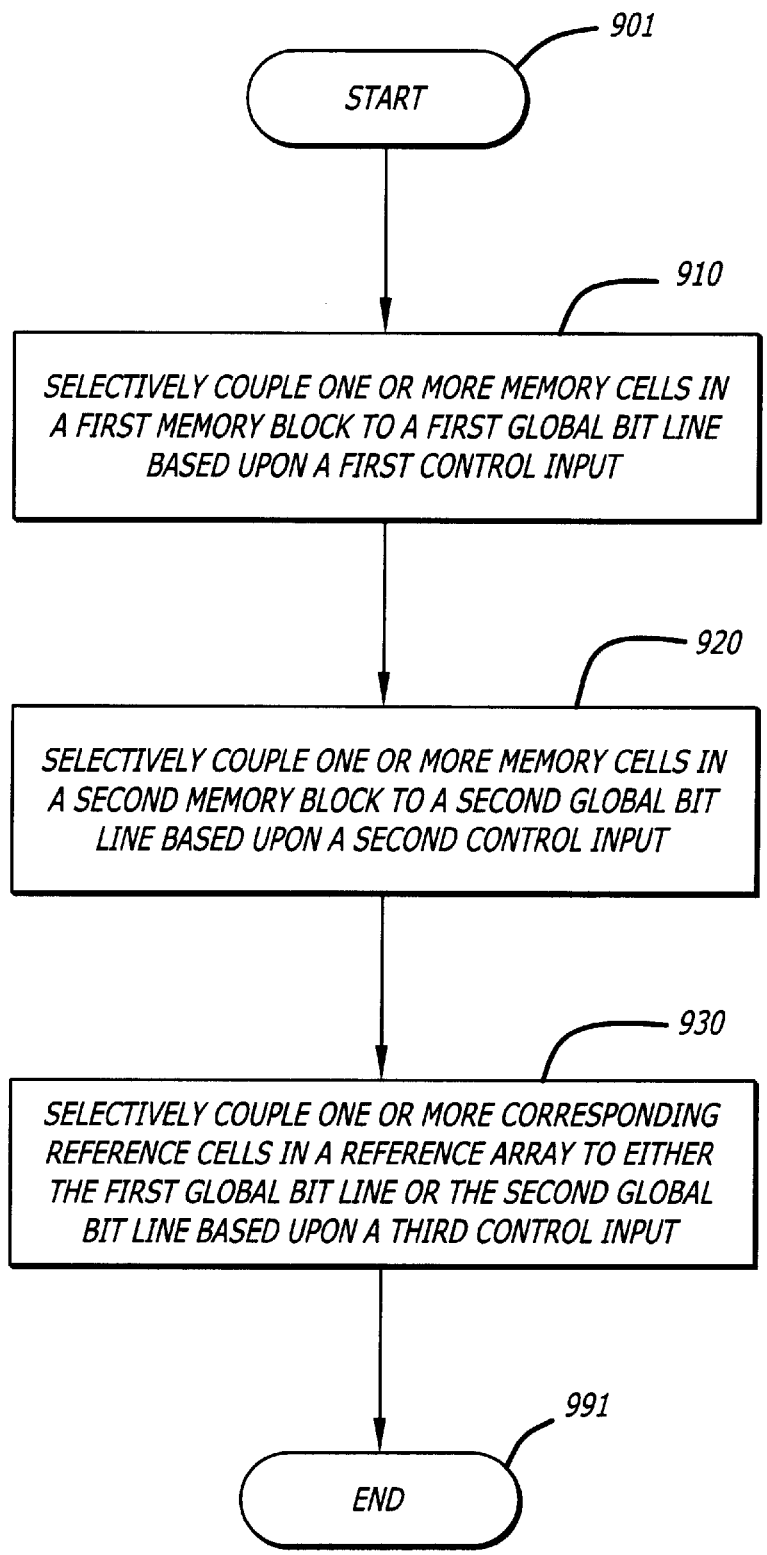
FIG. 9 shows a flow diagram of one embodiment of a method according to the teachings of the present invention.

FIG. 9 is a flow diagram of one embodiment of a method according to the teachings of the present invention. At block 910, one or more memory cells in a first memory block are selectively coupled to a first global bit line based upon a first control input. At block 920, one or more memory cells in a second memory block are selectively coupled to a second global bit line based upon a second control input. At block 930, one or more reference cells in a reference cell array are selectively coupled to either the first global bit line or the second global bit line based upon a third control input. In one embodiment, to perform a read operation with respect to a memory cell in the first block, the respective memory cell in the first block is coupled to the first global bit line and a corresponding reference cell in the reference cell array is coupled to the second global bit line. The first and second global bit lines are coupled to a sense amplifier. In one embodiment, to perform a read operation with respect to a memory cell in the second block, the respective memory cell in the second block is coupled to the second global bit line and a corresponding reference cell in the reference cell array is coupled to the first global bit line. The first and second global bit lines are coupled to a sense amplifier. In one embodiment, the first and second global bit lines are adjacent global bit lines and are twisted in the layout to enable uniform coupling with respect to their neighboring global bit lines.

The invention has been described in conjunction with the preferred embodiment. It is evident that numerous alternatives, modifications, variations and uses will be apparent to those skilled in the art in light of the foregoing description.

What is claimed is:

1. A memory device comprising:
   a first array comprising a plurality of blocks each comprising a plurality of memory cells; and
   a second array comprising a plurality of reference cells that are used to sense data stored in the first array
   wherein the first array and the second array share a set of global bit lines which extends through the plurality of memory blocks of the first array, the global bit lines being used to selectively couple the memory cells in the first array and the reference cells in the second array to a sensing circuitry.

2. The memory device of claim 1 wherein each global bit line coupled to the first array and the second array is selected based upon the value of a corresponding select signal.

3. The memory device of claim 1 wherein odd numbered global bit lines are selectively connected to the reference cells in the second array and to odd numbered blocks in the first array and wherein even numbered global bit lines are selectively connected to the reference cells in the second array and to even numbered blocks in the first array.

4. The memory device of claim 3 wherein the odd numbered global bit lines and even numbered global bit lines are placed adjacent to each other and twisted in layout.

5. The memory device of claim 4 wherein a reference cell in the second array is selectively coupled to either a corresponding even numbered global bit line or a corresponding odd numbered global bit line, based upon a first control input.

6. The memory device of claim 5 wherein the each of the odd numbered blocks is selectively coupled to one or more corresponding odd numbered global bit lines based upon a corresponding second control input and each of the even numbered blocks is selectively coupled to one or more corresponding even numbered global bit lines based upon a corresponding third control input.

7. The memory device of claim 6 wherein, in response to a memory operation with respect to a memory cell in a selected odd numbered block, the respective memory cell in the selected odd numbered block is coupled to a corresponding odd numbered global bit line and a corresponding reference cell is coupled to a corresponding even numbered global bit line that is adjacent to the corresponding odd numbered global bit line to which the respective memory cell is coupled.

8. The memory device of claim 7 wherein, in response to a memory operation with respect to a memory cell in a selected even numbered block, the respective memory cell in the selected even numbered block is coupled to a corresponding even numbered global bit line and a corresponding reference cell is coupled to a corresponding odd numbered global bit line that is adjacent to the corresponding even numbered global bit line to which the respective memory cell is coupled.

9. The memory device of claim 1 wherein each block in the first array comprises a plurality of local bit lines each of which coupled to a corresponding set of memory cells in the respective block, each local bit line being selected to couple the corresponding set of memory cells to a corresponding global bit line and deselected to decouple the corresponding set of memory cells from the corresponding global bit line, based upon the value of a corresponding local signal.

10. A non-volatile memory comprising:
    a first block comprising a first local bit line and a plurality of memory cells coupled to the first local bit line;
    a second block comprising a second local bit line and a plurality of memory cells coupled to the second local bit line;
    a first global bit line and a second global bit line which extend through the first block and the second block, the first local bit line being selectively coupled to the first global bit line based upon a first control input and the second local bit line being selectively coupled to the second global bit line based upon a second control input; and
    a reference cell array comprising a plurality of reference cells, the plurality of reference cells being selectively coupled to either the first global bit line or the second global bit line based upon a third control input.

11. The non-volatile memory of claim 10 wherein the first local bit line is coupled to the first global bit line when the first control input is set to a first value and is decoupled from the first global bit line when the first control input is set to a second value.

12. The non-volatile memory of claim 10 wherein the second local bit line is coupled to the second global bit line when the second control input is set to a first value and is decoupled from the second global bit line when the second control input is set to a second value.

13. The non-volatile memory of claim 10 wherein:
    the third control input comprises a plurality of select signals corresponding to the number of the reference cells, each select signal being used to couple one or more corresponding reference cells to either the first global bit line or the second global bit line.

14. The non-volatile memory of claim 13 wherein the one or more corresponding reference cells are coupled to the first global bit line and decoupled from the second global bit line when the corresponding select signal is set to a first value, and wherein the corresponding reference cells are coupled to the second global bit line and decoupled from the first global bit line when the corresponding select signal is set to a second value.

15. The non-volatile memory of claim 10 wherein the first and second global bit lines are adjacent global bit lines.

16. The non-volatile memory of claim 15 wherein the first and second blocks are adjacent blocks.

17. The non-volatile memory of claim 10 wherein the first and second global bit lines are twisted in the layout.

18. The non-volatile memory of claim 10 wherein, in response to a read operation with respect to a memory cell in the first block, the respective memory cell in the first block is coupled to the first global bit line and a corresponding reference cell is coupled to the second global bit line.

19. The non-volatile memory of claim 10 wherein, in response to a read operation with respect to a memory cell in the second block, the respective memory cell in the second block is coupled to the second global bit line and a corresponding reference cell is coupled to the first global bit line.

20. A non-volatile memory comprising:
    a plurality of memory blocks each of which comprising a plurality of memory cells, the plurality of memory blocks comprising a first group of memory blocks and a second group of memory blocks, each block in the first group being adjacent to a block in the second group;

a reference cell array comprising a plurality of reference cells; and a set of global bit lines comprising a first subset of global bit lines and a second subset of global bit lines which extend through the plurality of memory blocks, each global bit line in the first subset being adjacent to a global bit line in the second subset, wherein each block in the first group being selectively coupled to one or more corresponding global bit lines in the first subset, and each block in the second group being selectively coupled to one or more corresponding global bit lines in the second subset, and wherein each of the reference cells being selectively coupled to either a corresponding global bit line in the first subset or a corresponding global bit line in the second subset.

21. The non-volatile memory of claim 20 wherein each memory block comprising a plurality of local bit lines each of which being coupled to one or more corresponding memory cells in the respective block, each local bit line being selectively coupled to a corresponding global bit line based upon a corresponding select signal.

22. The non-volatile memory of claim 21 wherein, in response to a read command with respect to one or more memory cells in a selected block, the one or more memory cells are coupled to a corresponding global bit line and one or more corresponding reference cells are coupled to a global bit line that is adjacent to the corresponding global bit line.

23. The non-volatile memory of claim 22 wherein, in response to a read command with respect to a memory cell in the first group, the respective memory cell in the first group is coupled to a corresponding global bit line in the first subset and a corresponding reference cell is coupled to a global bit line in the second subset that is adjacent to the corresponding global bit line in the first subset.

24. A system comprising:

first processor; and a non-volatile memory coupled to the first processor, comprising:

a first block comprising a first local bit line and a plurality of memory cells coupled to the first local bit line;

a second block comprising a second local bit line and a plurality of memory cells coupled to the second local bit line;

a first global bit line and a second global bit line which extend through the first block and the second block, the first local bit line being selectively coupled to the first global bit line based upon a first control input and the second local bit line being selectively coupled to the second global bit line based upon a second control input; and a reference cell array comprising a plurality of reference cells, the plurality of reference cells being selectively coupled to either the first global bit line or the second global bit line based upon a third control input.

25. The system of claim 24 wherein the first and second global bit lines are twisted in the layout.

26. The system of claim 24 wherein, in response to a read operation with respect to a memory cell in the first block, the respective memory cell in the first block is coupled to the first global bit line and a corresponding reference cell is coupled to the second global bit line.

27. The system of claim 26 wherein, in response to a read operation with respect to a memory cell in the second block, the respective memory cell in the second block is coupled to the second global bit line and a corresponding reference cell is coupled to the first global bit line.

28. A method comprising:

selectively coupling one or more memory cells in a first memory block to a first global bit line based upon a first control input and one or more memory cells in a second memory block to a second global bit line based upon a second control input, the first and second global bit line extending through the first memory block and the second memory block; and selectively coupling one or more reference cells in a reference cell array to either the first global bit line or the second global bit line based upon a third control input.

29. The method of claim 28 wherein the first and second global bit lines are twisted in layout.

30. The method of claim 28 further comprising:

performing a read operation with respect to a memory cell in the first block, comprising:

coupling the respective memory cell in the first block to the first global bit line and coupling a corresponding reference cell in the reference cell array to the second global bit line; and performing a read operation with respect to a memory cell in the second block, comprising:

coupling the respective memory cell in the second block to the second global bit line and coupling a corresponding reference cell in the reference cell array to the first global bit line.

* * * * *

UNITED STATES PATENT AND TRADEMARK OFFICE
CERTIFICATE OF CORRECTION

PATENT NO. : 6,515,906 B2
DATED : February 4, 2003
INVENTOR(S) : Tedrow et al.

It is certified that error appears in the above-identified patent and that said Letters Patent is hereby corrected as shown below:

Column 5,
Line 32, after "numbered", delete "-umbered".
Line 60, after "numbered", delete "-umbered".

Column 7,
Line 1, before "global bit", delete "umbered".

Signed and Sealed this

Twenty-third Day of March, 2004

JON W. DUDAS
*Acting Director of the United States Patent and Trademark Office*